United States Patent [19]

Deleganes et al.

[11] Patent Number: 5,434,822
[45] Date of Patent: Jul. 18, 1995

[54] APPARATUS AND METHOD FOR ADJUSTING AND MAINTAINING A BITLINE PRECHARGE LEVEL

[75] Inventors: Daniel J. Deleganes, Hillsboro; Robert D. Creek, Aloha, both of Oreg.

[73] Assignee: Intel Corporation, Santa Clara, Calif.

[21] Appl. No.: 271,865

[22] Filed: Jul. 7, 1994

[51] Int. Cl.⁶ .......................... G11C 7/00; G11C 11/40
[52] U.S. Cl. .............................. 365/203; 365/189.110; 365/204
[58] Field of Search .................... 365/189.11, 203, 204, 365/189.06, 189.09

[56] References Cited

U.S. PATENT DOCUMENTS 4,943,943  7/1990  Lai ......................................... 365/204
5,187,686  2/1993  Tran et al. ....................... 365/189.11
5,202,855  4/1993  Morton ............................. 365/189.11

*Primary Examiner*—David C. Nelms
*Assistant Examiner*—Tan Nguyen
*Attorney, Agent, or Firm*—Blakely, Sokoloff, Taylor & Zafman

[57] ABSTRACT

A precharge circuit for adjusting and maintaining a bitline of a ROM to a pre-determined precharge voltage. The circuit is comprised of P-channel pull-up transistors for initially placing an input line and a node of the precharge circuit at the supply voltage. A relatively small transistor is coupled to the node. Its function is to pull the node's voltage down when a control signal is activated. A larger transistor is also coupled to the node. The larger transistor is used to compensate for the pull down action of the small transistor. The relative sizes of the small transistor versus the larger transistor is made such that the node is placed at the desired quiescent level. The node is maintained at this level until the wordline is activated and the programmed bitline begins discharging. When discharging of the bitline causes the node's voltage to fall below a given threshold voltage through the source follower action of the large transistor, the output from the circuit is pulled down hard to a ground level.

12 Claims, 8 Drawing Sheets

APPARATUS AND METHOD FOR ADJUSTING AND MAINTAINING A BITLINE PRECHARGE LEVEL

FIELD OF THE INVENTION

The present invention pertains to the field of memory devices and embedded memories. More particularly, the present invention relates to an apparatus and method for adjusting and maintaining a bitline precharge level.

BACKGROUND OF THE INVENTION

Microprocessors often contain a small dedicated memory, commonly referred to as a control read only memory (CROM), for storing micro-code instructions. An array of bitlines and wordlines are used to access the micro-code stored in the CROM. As microprocessors became faster, there arose a need to access the CROM more quickly. One solution involved precharging the bitlines to a level close to the trip point of the sensing stage. Thereby, a small swing in voltage on the bitlines would cause the bitline to trigger a sense amplifier and decoder. One implementation involved the coupling of an N-channel pull-up transistor to a bitline to set the precharge level. Consequently, the bitline would be precharged to the supply voltage minus the threshold voltage of the N-channel transistor. For example, given a supply voltage of $V_{CC}=3.3$ v, an N-channel threshold of $V_{TN}=1.0$ v and a trip point of $V_{TP}=1.6$ v, bitline voltage $V_{CC}-V_{TN}=3.3$ v$-1.0$ v$= 1.0$ v$=2.3$ v would only have to be dropped by approximately 2.3 v$-V_{TP}=0.7$ v. Hence, by precharging the bitline to 1 $V_{TN}$ down from $V_{CC}$, the CROM can be accessed faster because a 0.7 v drop can be achieved much more quickly than a 1.7 v drop. Often the speed of the sensing stage is reliant on this initial precharge level. If a mechanism is present that causes a bitline to reach a level greater than $V_{CC}-V_{TN}$ prior to being accessed, then the access time of the sensing circuit is degraded. CROM sensing circuits using such a $V_{TN}$ precharge level incur a push-out from wordline active to valid output when a bitline is at full $V_{CC}$ level when the access begins. In some cases this push-out can be as high as 50%. This push-out behavior is typical of such "level dependent" sensing circuits that are used to reach the access times demanded by the high clock frequencies of today's microprocessors.

There are several situations where a ROM bitline reliant on N-channel precharging would reach levels greater than $V_{CC}$ minus $V_{TN}$. It is known that the sub-threshold leakage of an N-channel pull-up, precharging a typical CROM bitline will be orders of magnitude greater than the junction leakage of a single programming diffusion. In addition, the downward leakage through the programming device is minimal compared to the upward leakage through the pull-up because the gate to source potential of an off programming device is very near zero. Conversely, the pull-up's gate to source potential varies with the bitline level. Thus, its sub-threshold leakage is initially relatively high and falls off exponentially only as the bitline (e.g., the source) leaks up. The net leakage on the bitline causes it to drift upwards toward the chip supply level.

In addition, a ROM is sensitive to the effects of sub-threshold leakage when utilizing N-channel bitline precharge. This is particularly true if a stop-clock feature is implemented. During stop-clock, the CROM bitlines might rest indefinitely in the precharge state. Consequently, there is ample time for the bitlines to leak to the chip supply level. Hence, traditional solutions that relied on nominal activity factors to discharge the bitlines periodically no longer apply to stop-clock microprocessors.

In addition to static leakage mechanisms, the bitlines of a ROM are susceptible to coupling from neighboring array structures. Furthermore, the bitlines are also susceptible to any overlying signal lines present in a multi-level metal process. The disturbance from such coupling sources is aggravated by the variable loading of ROM bitlines (minimally programmed bitlines are lightly loaded and their voltage levels can be moved easier). Using an N-channel bitline precharge structure such bitlines can be coupled towards the supply level or even higher. As a result, they are typically not recoverable to their desired precharge level.

In summary, prior art CROM array bitline levels are typically sensitive to leakage and coupling disturbance if N-channel precharge architecture were to be used. Such disturbance results in performance or functionality problems if "normal" precharge levels are designed as an integral part of the sensing scheme. Implementing a stop-clock mode aggravates this problem since it might create lengthy periods of leakage opportunity. These problems apply to any ROM or RAM array structure where the bitline precharge function is performed by devices that enter cut off mode as the bitline precharge level is reached (e.g., an N-channel pull-up sourced to the chip supply) and where the initial bitline precharge level is a critical consideration for sensing. The leakage issues would also be extendible to any generic CMOS enhancement device process, since they rely on fundamental device sub-threshold and junction behaviors.

SUMMARY OF THE INVENTION

The present invention pertains to a precharge circuit for adjusting and maintaining a bitline of a ROM to a pre-determined precharge voltage. In the currently preferred embodiment, a level-shifter circuit is used to translate high bitline level down to a desired precharge level that is optimal for sensing. The level-shifter circuit is comprised of P-channel pull-up transistors for initially placing an input line and a node of the precharge circuit at the supply voltage. A relatively small transistor is coupled to the node. Its function is to pull the node's voltage down when a local precharge signal is activated. A larger transistor is also coupled to the node. The larger transistor is used to pull the node's voltage high thereby compensating for the pull down action of the small transistor. The relative sizes of the small transistor versus the larger transistor is made such that the node is placed at the desired precharge level. The node is maintained at this precharge level until the wordline is activated and the input (coupled to a programmed bitline) begins discharging. When discharging of the input causes the node's voltage to fall below a given threshold voltage, the output from the circuit is pulled down hard to a ground level.

In one embodiment, a pre-discharge circuit is used to temporarily discharge bitlines that are selectable in the next access cycle. The bitlines are temporarily discharged prior to the end of a normal bitline precharge and prior to the onset of a normal bitline access. In another embodiment, P-channel transistor stacks are coupled to the bitlines to provide a leakage source to ground. In yet another embodiment of the present invention, current sources are coupled to the bitlines. These current sources are used to control the current in the pull down devices for precharging the bitlines. If the precharge voltage is excessive, a bias control circuit causes the appropriate current source to conduct more current from that bitline.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

An apparatus and method for maintaining memory precharge at an optimal level is described. In the following description, for purposes of explanation, numerous specific details are set forth, such as circuit diagrams and timing diagrams, etc., in order to provide a thorough understanding of the present invention. It will be obvious, however, to one skilled in the an that the present invention may be practiced without these specific details. In other instances, well-known structures and devices are shown in block diagram form in order to avoid unnecessarily obscuring the present invention. Furthermore, it should be noted that the present invention applies to any ROM or RAM array structure having bitlines that are precharged to a predetermined level.

Figure 1:
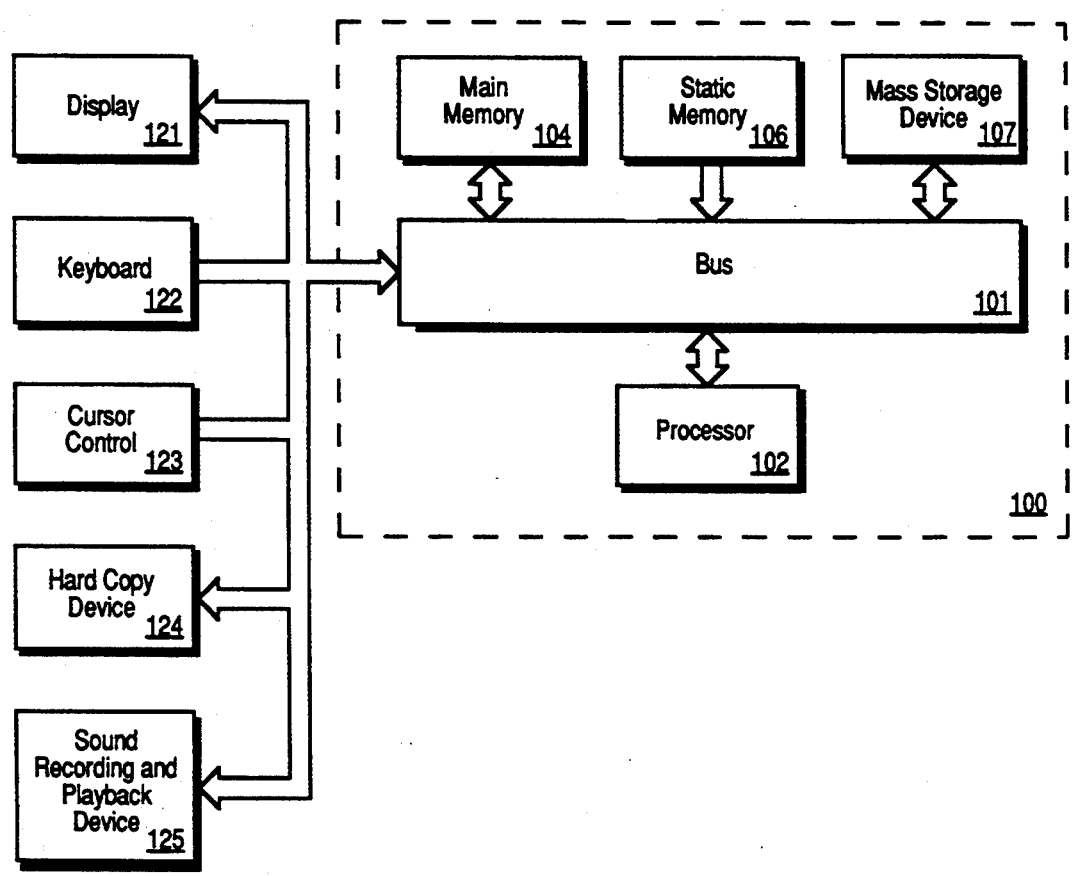
FIG. 1 shows the computer system upon which the preferred embodiment of the present invention can be implemented.

Referring to FIG. 1, the computer system upon which the preferred embodiment of the present invention can be implemented is shown as 100. Computer system 100 comprises a bus or other communication means 101 for communicating information, and a processing means 102 coupled with bus 101 for processing information. System 100 further comprises a random access memory (RAM) or other dynamic storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises a read only memory (ROM) and/or other static storage device 106 coupled to bus 101 for storing static information and instructions for processor 102. Data storage device 107 is coupled to bus 101 for storing information and instructions.

Furthermore, a data storage device 107 such as a magnetic disk or optical disk and its corresponding disk drive can be coupled to computer system 100. Computer system 100 can also be coupled via bus 101 to a display device 121, such as a cathode ray tube (CRT), for displaying information to a computer user. An alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121. This input device typically has two degrees of freedom in two axes, a first axis (e.g., x) and a second axis (e.g., y), which allows the device to specify positions in a plane.

Another device which may be coupled to bus 101 is hard copy device 124 which may be used for printing instructions, data, or other information on a medium such as paper, film, or similar types of media. Additionally, computer system 100 can be coupled to a device for sound recording and/or playback 125 such as an audio digitizer coupled to a microphone for recording information. Further, the device may include a speaker which is coupled to a digital to analog (D/A) converter for playing back the digitized sounds. Finally, computer system 100 can be a terminal in a computer network (e.g., a LAN).

Described below are four different embodiments for maintaining bitlines at an optimal precharge level. In the currently preferred embodiment, bitlines are charged to a full $V_{CC}$ level and a level-shifter circuit is used to translate the higher bitline level down to a level that is optimal for sensing. This translator circuit approach is applicable to both single-ended and differential-ended bitline signals. Although the current dissipated in this embodiment is higher than in traditional ROM sensing designs, positive feedback can be used to control the degree of increase in the current. In general, the bitline precharge level is maintained at a well controlled value. This is accomplished by using an active precharge device (e.g., a P-channel pull-up sourced to $V_{CC}$), rather than one that is in cut off mode. Thereby, leakage problems are eliminated. Furthermore, this design significantly minimizes coupling disturbances by virtue of the active drive on the bitline during precharge time. This level-shifter circuit allows implementation of a sensing scheme that is tolerant of full $V_{CC}$ precharge level.

Figure 2:
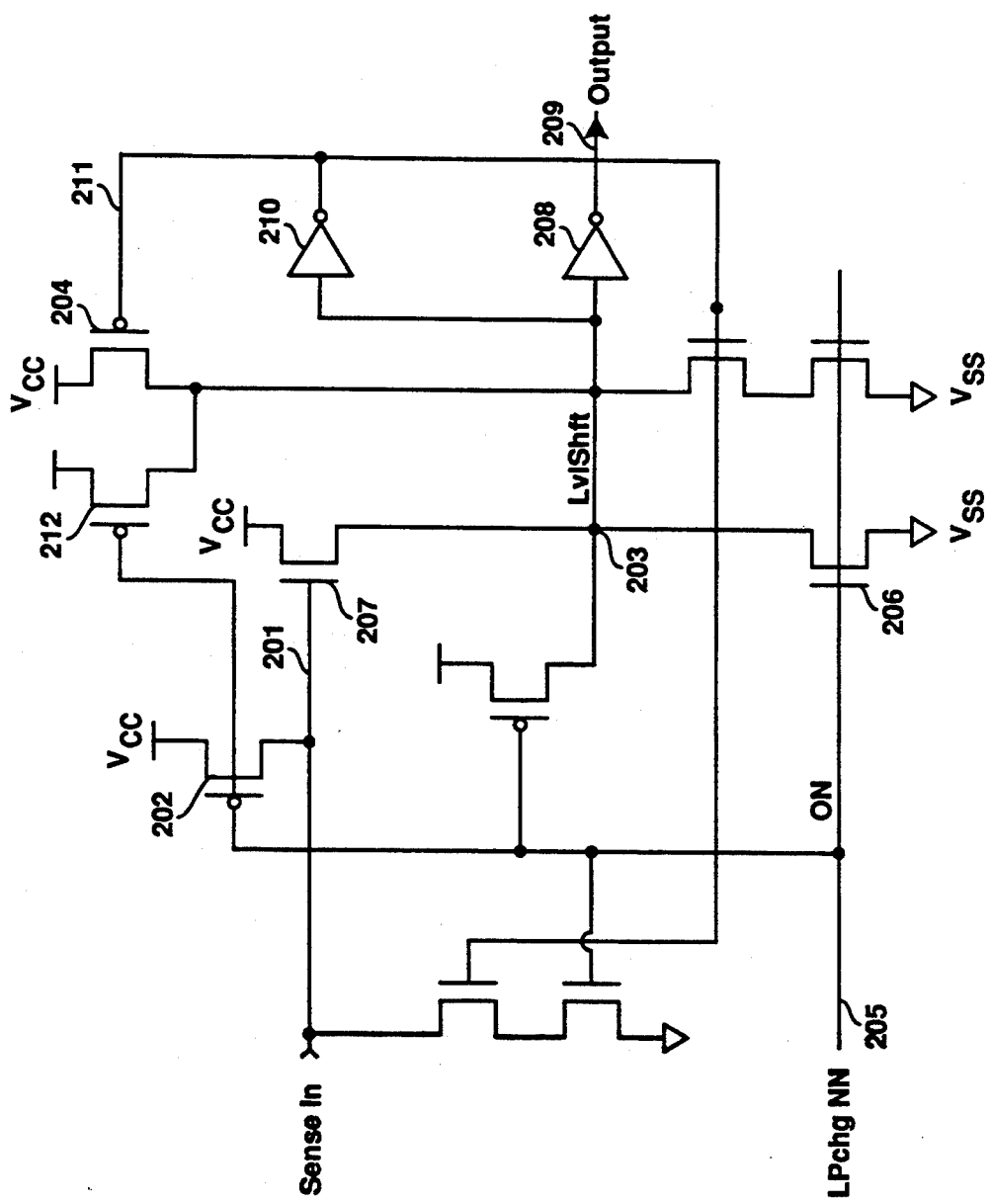
FIG. 2 shows an example of a level-shifter circuit for translating the higher bitline level down to a level that is optimal for sensing.

Referring to FIG. 2, an example of a level-shifter circuit for translating the higher bitline level down to a level that is optimal for sensing is shown. Initially, the SenseIn line 201 and the LvlShft node 203 are precharged respectively by the P-channel transistors 202 and 212. Device 212 actually performs the precharge while device 204 provides for increased noise insensitivity. Hence, at the beginning of a cycle, the SenseIn line 201 and LvlShft node 203 are resting at $V_{CC}$. When the local-precharge-bar signal LPchgNN on line 205 transitions high signaling the end of precharge, the N-channel transistor 206 becomes enabled. When transistor 206 becomes enabled, it pulls the LvlShft node 203 down towards $V_{SS}$. Transistor 206 continues pulling node 203 down until the N-channel transistor 207 starts conducting enough current to offset the action by transistor 206. The relative size of transistor 207 to transistor 206 is chosen such that transistor 207 will always stop the LvlShft node 203 at approximately 1 $V_{TN}$ down from $V_{CC}$. When the wordline fires and a programmed bitline begins discharging, the SenseIn line 201 follows the bitline. For the case of a fully programmed bitline this rate is relatively slow (e.g., 0.5 volts per nanosecond). As this occurs, the N-channel transistor 207 acts as a source follower. Thereby, the LvlShft node 203 begins discharging through the N-channel transistor 206 at roughly the same rate as the SenseIn line 201. When the LvlShft node 203 passes the trip point established by inverter 208, the output signal of the circuit (line 209) transitions. As the LvlShft node 203 passes the trip point established by inverter 210, the feedback node 211 transitions. This causes the SenseIn line 201 and LvlShft node 203 to become pulled down hard to $V_{SS}$. The trip point of the feedback inverter 210 is set slightly lower than the forward inverter 208. This allows for greater noise tolerance on the latching action of the circuit. It should be noted that one benefit with this embodiment is that the LvlShft node 203's quiescent level is near the trip point of the forward inverter 208. Thus, only a small amount of signal is needed on the bitlines for sensing to occur. Furthermore, if the level-shifter is removed, the access push-out is approximately equal to the amount of time needed for the bitline to develop another 1 $V_{TN}$ worth of signal.

Figure 3:
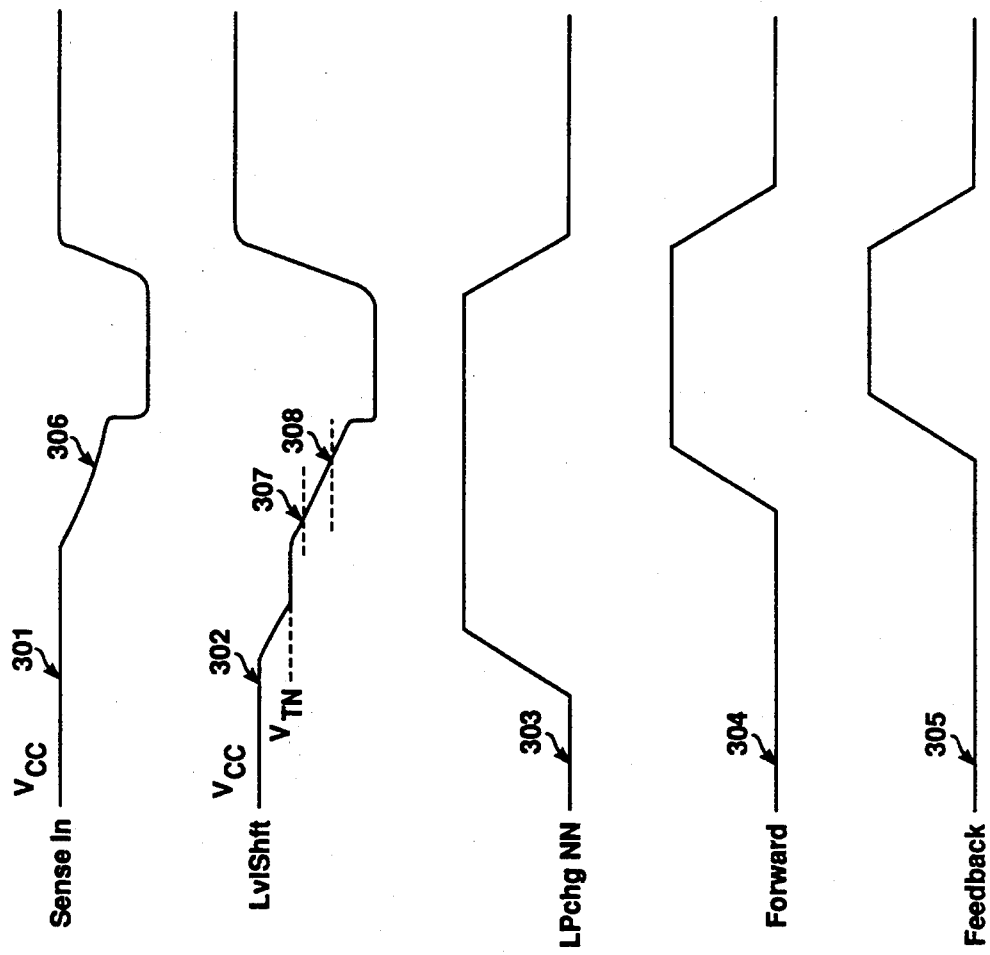
FIG. 3 shows a flowchart describing several signals of the level-shifter circuit.

FIG. 3 shows a timing diagram describing several signals of the circuit. It can be seen that the SenseIn signal 301 and LvlShft signal 302 are initially precharged to $V_{CC}$. Signals 301 and 302 remain at $V_{CC}$ until the local-precharge-bar signal 303 transitions high. When the local-precharge-bar 303 transitions high, the LvlShft signal 302 is pulled down towards $V_{SS}$. The LvlShft signal 302 is pulled down to a quiescent level approximately 1 $V_{TN}$ below $V_{CC}$. When the wordline fires and a programmed bitline begins discharging, the SenseIn signal 301 follows the bitline and slowly starts to discharge as indicated by 306. Simultaneously, the LvlShft signal 302 is being discharged at approximately the same rate as the SenseIn signal 301.

When the LvlShft signal 302 passes the trip point 307, the output signal 304 transitions. As the LvlShft signal 302 continues past trip point 308, the feedback signal 305 becomes active. This causes the SenseIn signal 301 and LvlShft signal 302 to be pulled down to $V_{SS}$. Signals 301 and 302 remain low while signals 303-305 are high until the next cycle occurs. Upon initiation or in anticipation of the next cycle, node 303 will transition low (indicating that precharge has been enabled) causing the SenseIn signal 301 and LvlShft signal 302 to be precharged again to $V_{CC}$ while the signals 304 and 305 are preconditioned low.

Figure 4A:
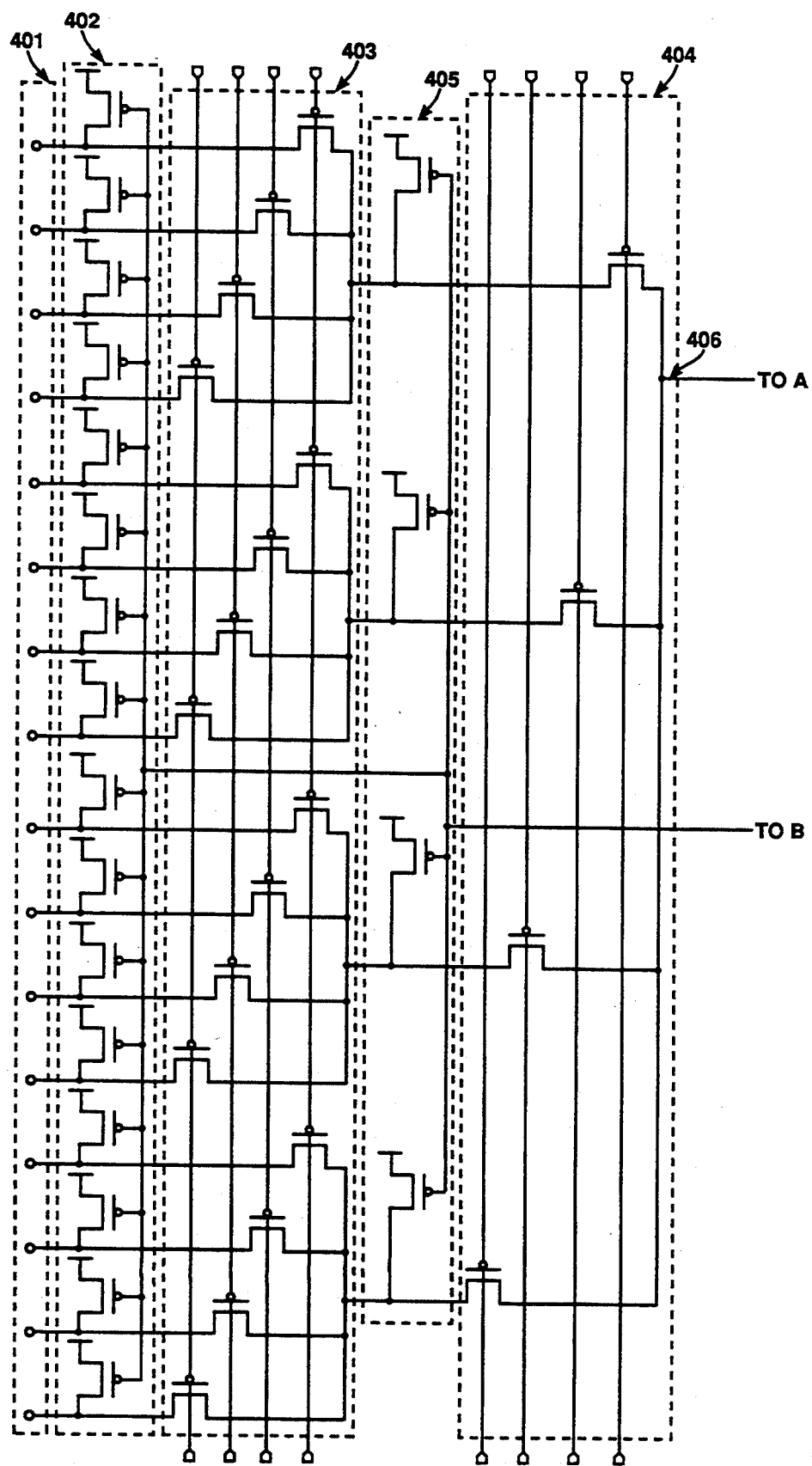
FIG. 4 shows a detailed schematic of the level-shifter and sense circuit.
Figure 4B:
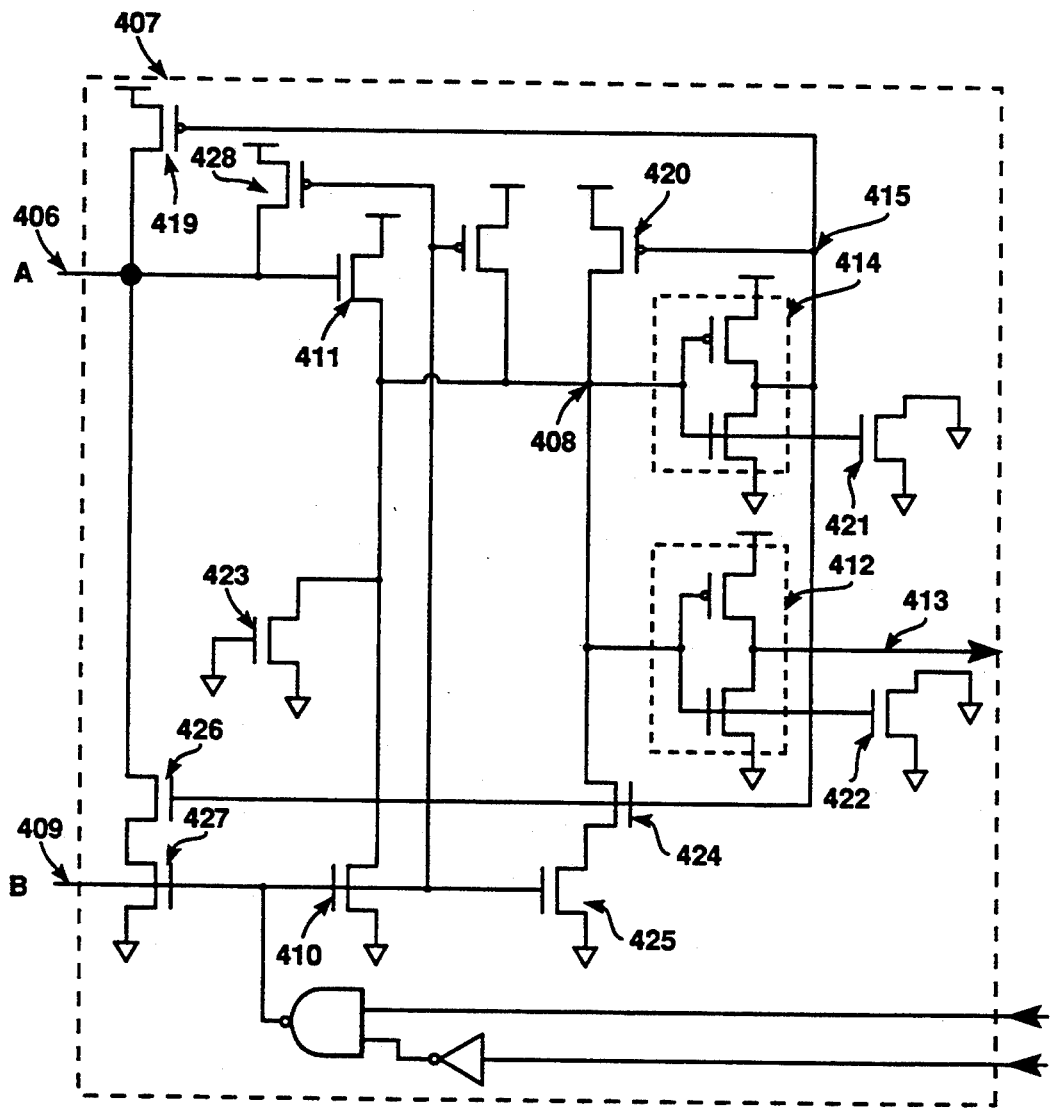

FIG. 4 shows a detailed schematic of the level-shifter and sense circuitry. 16 bitlines 401 are shown entering the circuit. Each bitline has its own precharge device. This is shown by the P-channel transistors 402. Column decoding circuitry 403 and 404 are coupled to the bitline 401. Included in-between the two stages of column decoding 403 and 404 are precharge devices 405. Precharge devices 405 are comprised of P-channel transistors to ensure that all the nodes in the circuit including the bitlines are precharged to a full chip supply level in a timely manner. It should be noted that in each set of column decoder control signals, one of these signal is always active at any given time. The output signal SenseIn on line 406 of the column decoder sections 403 and 404 is input to the level shift/sense circuit 407. Thus, the bitlines, the column decoder internal nodes, the SenseIn line 406 and the LvlShft node 408 are all precharged so that at the beginning of a cycle, they are resting at $V_{CC}$. When the local-precharge-bar signal on line 409 transitions high, the N-channel transistor 410 starts conducting current. Thereby, transistor 410 pulls the LvlShft node 408 down towards $V_{SS}$ until the N-channel transistor 411 turns on enough to counteract transistor 410. The relative sizes of transistor 411 to transistor 410 is such that transistor 411 will always stop the LvlShft node 408 at approximately $V_{CC}$-$V_{TN}$.

When the wordline fires and a programmed bitline begins discharging, the SenseIn node 406 follows this bitline if the bitline is selected by the column decoding circuitry 403 and 404. As the SenseIn node 406 discharges, the transistor 411 acts as a source follower, and the LvlShft node 408 begins discharging through transistor 410 at roughly the same rate the SenseIn node 406 is discharging. When the LvlShft signal on node 408 passes the trip point of the forward inverter 412, the output signal on line 413 of the level shift/sense circuit 407 transitions from a low to a high state. As the LvlShft signal on node 408 passes the trip point of the feedback inverter 414, the signal corresponding to the feedback node 415 will transition from a low to a high state. In turn, this transition causes the SenseIn signal of line 406 and the LvlShft signal of node 408 to become pulled down hard to $V_{SS}$ through devices 426–427 and 424–425, respectively The trip point of the feedback inverter 414 is set slightly lower than that of the forward inverter 412. This allows greater noise insensitivity for the latching action of the circuit. One benefit with this design is that the quiescent level of the LvlShft node 408 is close to the trip point of the forward inverter 412. Hence, very little signal is needed on the bitlines for sensing to occur. If the level shift circuitry (comprised of 410, 411, 419, 423, 426, 427, 428) is removed and the SenseIn node 406 is shorted to node 408, the access push-out is approximately equal to the amount of time needed for the bitlines 401 to develop another 1 $V_{TN}$ of signal. If, however, there is not a programmed bit at the wordline and bitline intersection being read, the bitline and the SenseIn line should remain at $V_{CC}$. In turn, tile LvlShft signal on node 408 remains at approximately $V_{CC}$-$V_{TN}$ as set by transistors 410 and 411. During this time there is some amount of flow-through current in the forward and feedback inverters 412 and 414. However, the outputs from these inverters do not transition, provided that their trip points have been correctly set. In the currently preferred embodiment, at $V_{CC}$ 3.3 V; junction temp = 120° C., the feedback inverter has a trip point = 1.23 V and the forward inverter has a trip point 1.37 V.

The P-channel transistors 420 and 419 are added to provide a degree of noise immunity to the LvlShft node 408 and SenseIn line 406, respectively. In addition, transistor 420 contributes to the quiescent level of the LvlShft signal on node 408. The N-channel transistors 421 and 422 are used for circuit adjustment options to adjust the trip points of the forward and feedback inverters using mask options, fuses, or a ion mill cut/deposition. The N-channel transistor 423 is used to match the surrounding topology corresponding of transistor 410 with that of transistor 411.

In a second embodiment, a circuit is used to pre-discharge all array bitlines that are selectable in the next access cycle. These array bitlines are pre-discharged at a time just prior to the end of normal bitline precharge and the onset of a normal bitline access. This embodiment permits bitline precharge through the use of a pull-up in cut off mode (such as a N-channel device). It also has the advantage that the resultant bitline precharge level offers high performance sensing using a simple sensing approach. The pre-discharge function is a remedy for the bitline level disturbances that occur. In a circuit implementation, a short timing pulse is generated. This timing pulse provides a momentary weak discharge of the bitlines through discharge devices attached to each of the bitlines. In the event that any bitlines had been disturbed to a level higher than $V_{CC} - V_{TN}$, the discharge action pulls the bitlines to a level low enough to activate the primary N-channel precharge pull-up. This enables the bitlines to be restored up to the expected level in time for sensing.

Figure 5:
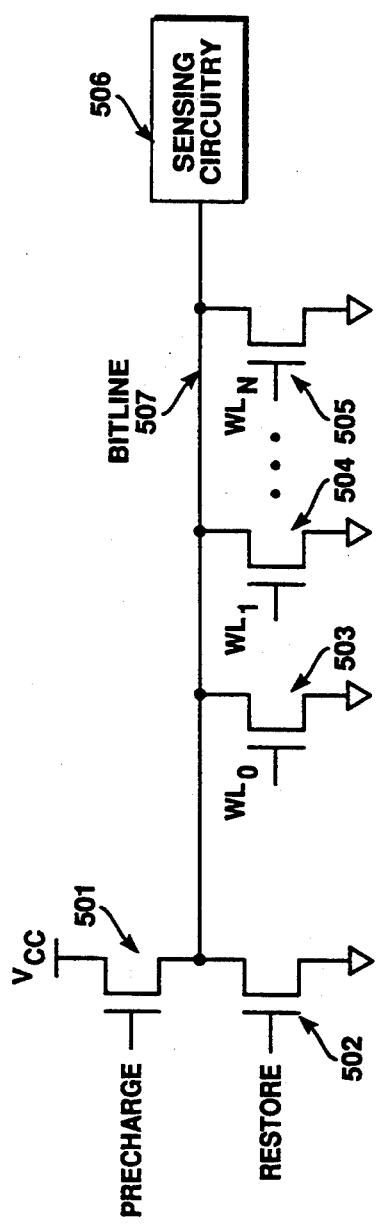
FIG. 5 shows a circuit diagram of an example of a predischarge circuit.

FIG. 5 shows a circuit diagram of an example of a predischarge circuit. A relatively large N-channel precharge transistor 501 is coupled in-between $V_{CC}$ and bitline 507. A relatively small N-channel restore transistor 502 is coupled from bitline 507 to ground. Several small programmable transistors 503–505 are used to couple the wordlines to bitline 507. The state of bitline 507 is determined by sensing circuitry 506.

Figure 6:
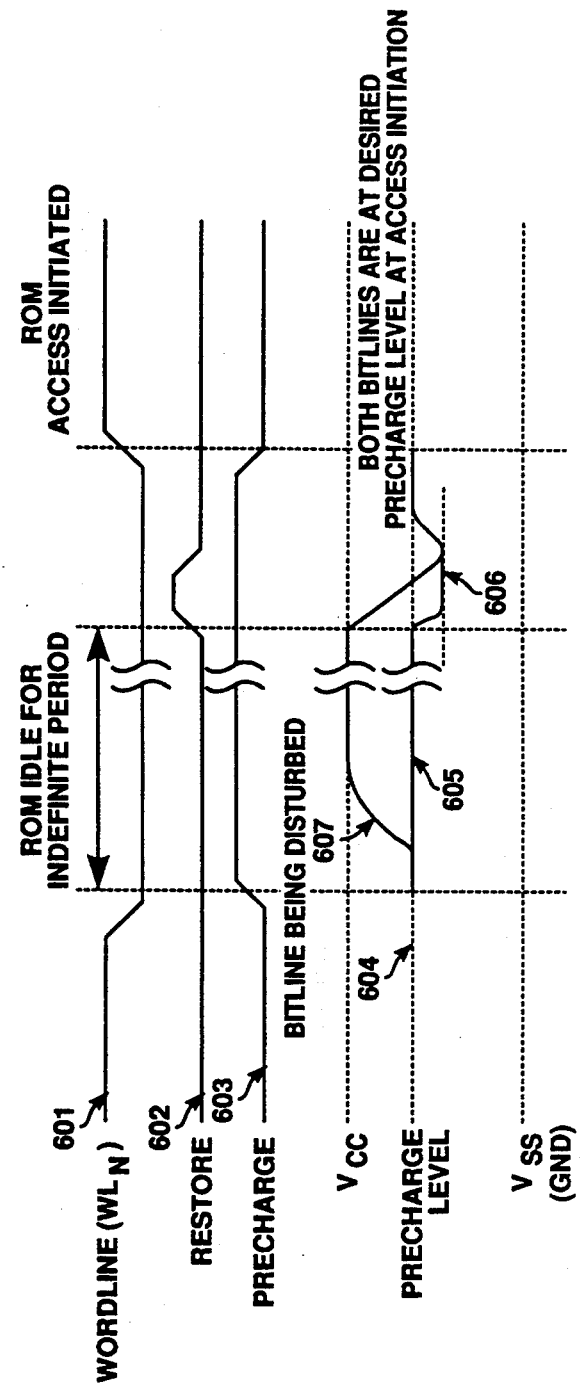
FIG. 6 shows a timing diagram corresponding to the predischarge circuit.

FIG. 6 shows a timing diagram corresponding to the predischarge circuit. Initially, when the wordline 601 transitions from a high to a low level, a precharge signal 603 is activated. Activation of precharge signal 603 causes the bitline to be precharged to a predetermined level 604. After the ROM has been idle for indefinite period, the restore signal 602 is activated for a short amount of time. If the bitline had remained undisturbed as indicated by 605, the precharge level 604 is temporarily lowered as shown by 606. However, if the bitline had been disturbed as indicated by 607, the abnormally high precharge level is also pulled all the way down to level 606 by the restore pulse. At the end of the restore pulse, the precharge level returns to its desired voltage. Thereby, ROM access is initiated at the proper precharge level. More complicated timing schemes could be used to optimize power and performance.

In a third embodiment of the present invention, a P-channel device is stacked to each bitline as a leakage source to ground. This embodiment permits bitline precharge through the use of a pull-up in cut off mode (such as a N-channel device). This approach provides a weak downward pull on the bitlines. Consequently, this prevents the primary pull-up device from being completely cut off. Thereby, a N-channel pull-up device could maintain control over the bitline levels. This embodiment counters any sub-threshold leakage issues (e.g., leakage that would pull the bitlines too high). Furthermore, it addresses coupling disturbance concerns. To provide more immunity to bitline coupling, P-channel shorter devices between all bitlines which are active during the precharge cycle can be implemented. These shorter devices help control severe coupling on individual bitlines by averaging the coupling across multiple bitlines. In such a situation, heavily loaded (e.g., by programming) bitlines act as "charge sinks" to soften the higher magnitude coupling disturbances that the lighter loaded neighboring bitlines might experience.

Figure 7:
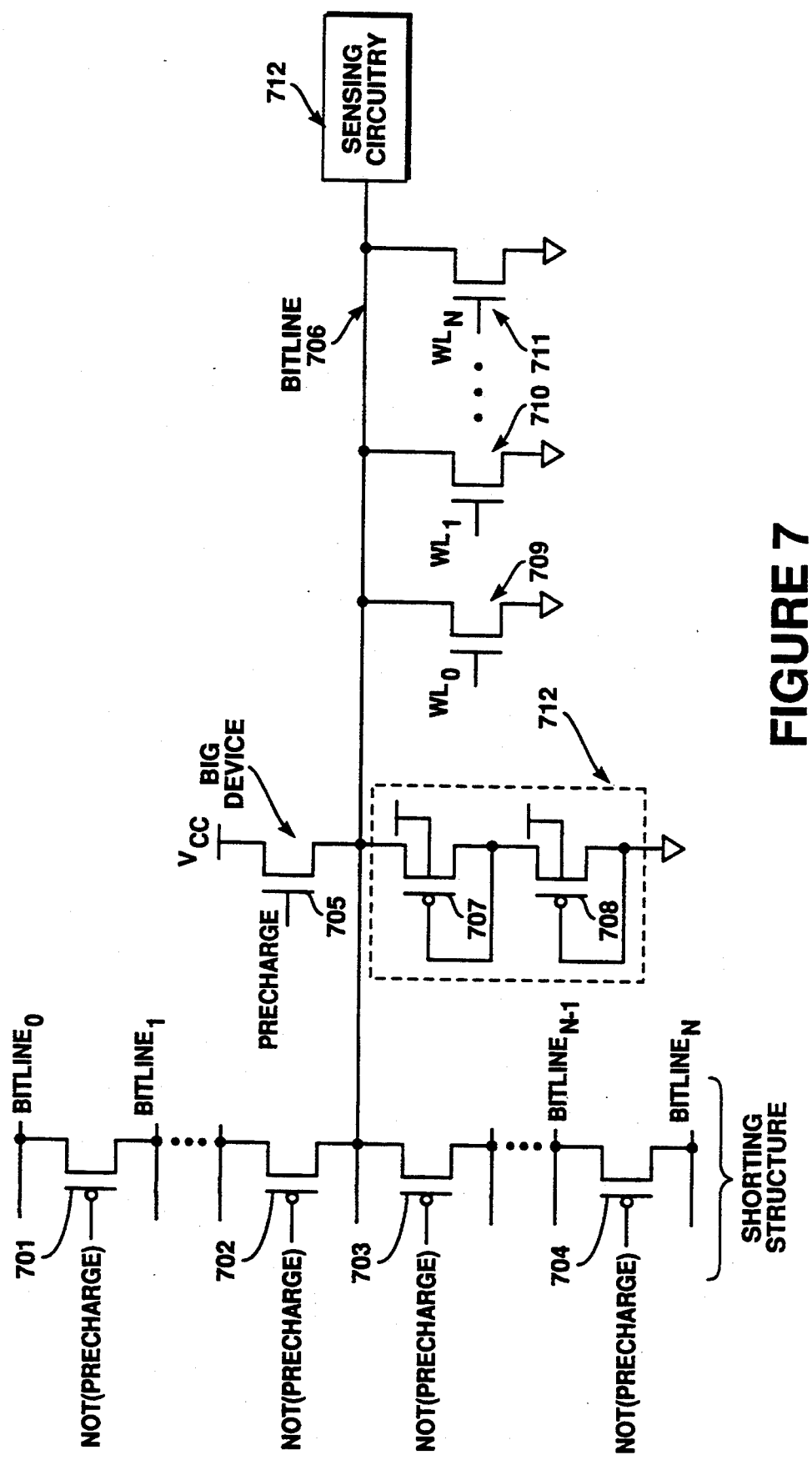
FIG. 7 shows a circuit diagram describing one example of a P-channel stack design.

FIG. 7 shows a circuit diagram describing one example of a P-channel stack design. A plurality of bitlines 0-n are shown. A number of P-channel transistors 701-704 are used to couple adjacent bitlines. For example, transistor 701 is used to short bitline 0 to bitline 1 in order to provide for additional bitline coupling immunity. A precharge transistor 705 is used to precharge bitline 706. A P-channel leakage stack 712 is also coupled to bitline 706. The P-channel leakage stack 712 provides a weak downward pull on bitline 706. The P-channel leakage stack 7 12 is comprised of two P-channel transistors 707 and 708 having their gate to source shorted. It should be noted that fewer or additional P-channel devices with gate to source shorted can be included in the P-channel leakage stack 712. A number of wordlines $WL_0$-$WL_n$ are also associated with bitline 706 via transistors 709–711. The state of bitline 706 is sensed by sensing circuitry 712.

In a fourth embodiment, a current mirror is used to control the current in a pull down device on the bitlines. The current mirror provides the same bitline control as described above for the third embodiment. Namely, the current mirror prevents an pull-up device from being cut off during precharge. This allows it to effectively maintain a controlled bitline precharge level (e.g., $V_{CC} - V_{TN}$ when a N-channel pull up device is used). This approach negates any sub-threshold leakage issues. Furthermore, coupling disturbance concerns are also addressed by this approach since this pull down stabilizing mechanism is more reactive than the stack embodiment described above.

Figure 8:
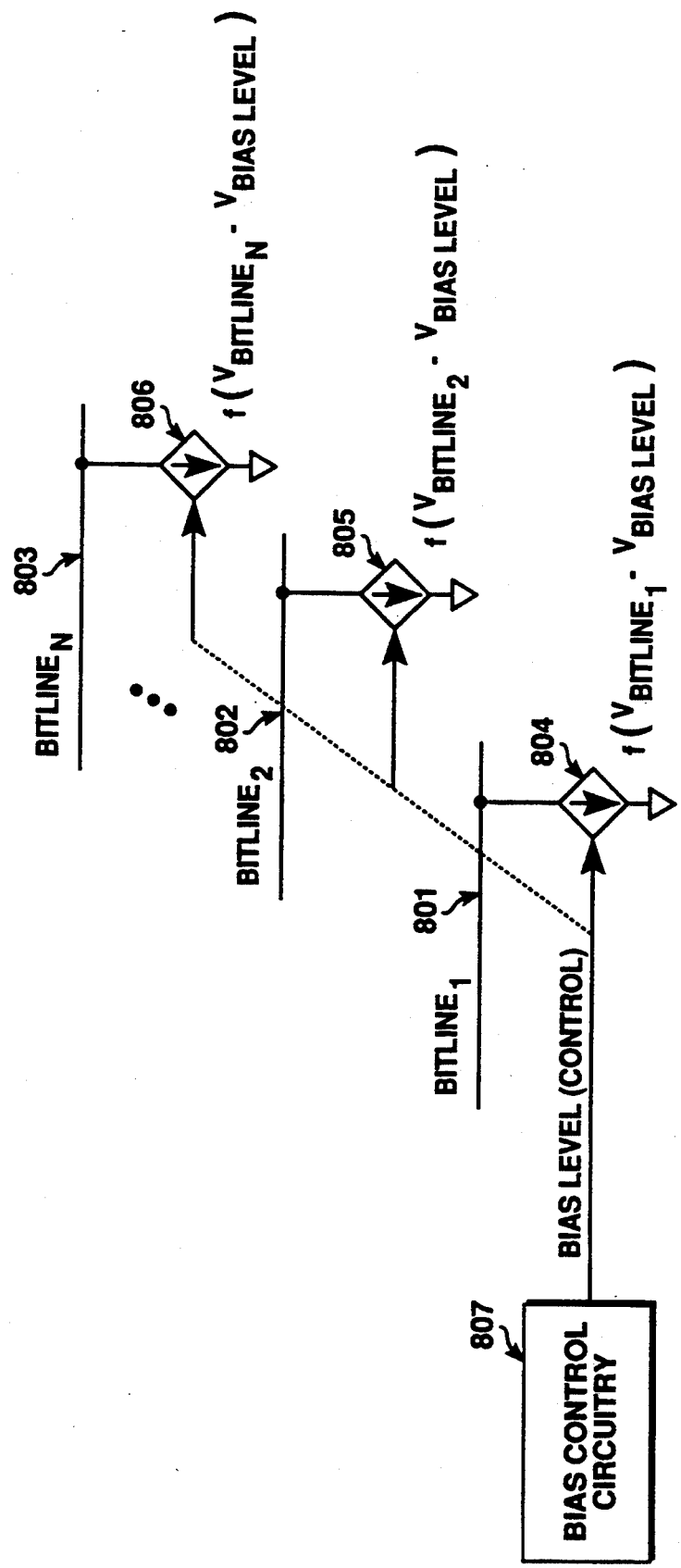
FIG. 8 shows a circuit diagram of voltage controlled current sources coupled to the bitlines.

FIG. 8 shows a circuit diagram of voltage controlled current sources coupled to the bitlines. A number of bitlines 801–803 are shown. Coupled to each bitline is a current source 804–806. A bias control circuit 807 is used to control the current sources 804–806. The current sources 804–806 conduct current according to the function of $f(V_{Bitline} - V_{Bias\ Level})$ where $f(V_{Bitline} - V_{Bias\ Level})$ equals 0 when $V_{Bitline}$ is less than or equal to the desired precharge level and where $f(V_{Bitline} - V_{Bias\ Level})$ equals a positive current when $V_{Bitline}$ is greater than the desired precharge level.

Thus, an apparatus and method for adjusting and maintaining a bitline precharge level is disclosed.

What is claimed is:

1. A circuit for maintaining a bitline at a pre-determined precharge voltage, wherein said bitline is used to access a memory, said circuit comprising:
    a first transistor for initially placing an input line at a reference voltage;
    a second transistor coupled to said first transistor for initially placing a node of said circuit at said reference voltage, wherein a voltage corresponding to said node is responsive to an input signal on said input line;
    a third transistor coupled to said second transistor for reducing said voltage corresponding to said node;
    a fourth transistor coupled to said third transistor for controlling an amount that said voltage corresponding to said node is reduced by said third transistor to correspond to said predetermined precharge voltage, wherein said voltage corresponding to said node is maintained at said precharge voltage until said bitline begins discharging.

2. The circuit of claim 1 further comprising a first inverter coupled to said node, wherein when discharging of said bitline causes said voltage corresponding to said node to fall below a first threshold voltage, said first inverter is activated and outputs an active signal.

3. The circuit of claim 2 further comprising a second inverter coupled to said first inverter, wherein when discharging of said bitline causes said voltage corresponding to said node to fall below a second threshold voltage, said second inverter is activated and causes said input signal and said voltage corresponding to said node to be pulled down to a ground level.

4. The circuit of claim 1, wherein said amount that said voltage corresponding to said node is reduced by said third transistor is approximately equal to a pre-determined voltage drop across said first transistor.

5. The circuit of claim 4, wherein said supply voltage is approximately 3.3 volts and said pre-determined voltage across said first transistor is in the range of 0.5 to 1.5 volts.

6. The circuit of claim 1, wherein said memory is a read only memory.

7. The circuit of claim 1, wherein said memory is a random access memory.

8. A computer system comprising:
a bus;
a main memory coupled to said bus for storing digital data;
a processor coupled to said bus for processing said digital data, said processor including a ROM for storing microcode, bitlines and wordlines for accessing said ROM, a decode circuit for decoding said bitlines and wordlines, and a precharge circuit for maintaining a bitline at a pre-determined precharge voltage, said precharge circuit comprising:
a first transistor for initially placing an input line at a reference voltage;
a second transistor coupled to said first transistor for initially placing a node of said circuit at said reference voltage, wherein a voltage corresponding to said node is responsive to an input signal on said input line;
a third transistor coupled to said second transistor for reducing said voltage corresponding to said node in accordance to a precharge signal;
a fourth transistor coupled to said third transistor for controlling an amount that said voltage corresponding to said node is reduced by said third transistor to correspond to said predetermined precharge voltage, wherein said voltage corresponding to said node is maintained at said precharge voltage until said bitline begins discharging.

9. The computer system of claim 8, wherein said precharge circuit further comprises a first inverter coupled to said node, wherein when discharging of said bitline causes said voltage corresponding to said node to fall below a first threshold voltage, said first inverter is activated and outputs an active signal.

10. The computer system of claim 9, wherein said precharge circuit further comprises a second inverter coupled to said first inverter, wherein when discharging of said bitline causes said voltage corresponding to said node to fall below a second threshold voltage, said second inverter is activated and causes said input signal and said voltage corresponding to said node to be pulled down to a ground level.

11. The computer system of claim 8, wherein said amount that said voltage corresponding to said node is reduced by said third transistor is approximately equal to a pre-determined voltage across said first transistor.

12. The computer system of claim 11, wherein said supply voltage is approximately 3.3 volts and said voltage drop across said first transistor is in the range of 0.5 to 1.5 volts.

* * * * *

UNITED STATES PATENT AND TRADEMARK OFFICE
CERTIFICATE OF CORRECTION

PATENT NO.    : 5,434,822
DATED         : July 18, 1995
INVENTOR(S)   : Deleganes et al.

It is certified that error appears in the above-identified patent and that said Letters Patent is hereby corrected as shown below:

In column 1 at line 30 insert --the-- following "1.6 v," and prior to "bitline"

In column 3 at line 41 delete "an" and insert --art--

In column 6 at line 43 delete "tile" and insert --the--

In column 6 at line 50 delete "$V_{CC}32$ 3.3 V" and insert --$V_{CC}=3.3$ V--

Signed and Sealed this

Fifteenth Day of October, 1996

Attest:

BRUCE LEHMAN

Attesting Officer          Commissioner of Patents and Trademarks